US012794413B2

(12) United States Patent
Gotanda et al.

(10) Patent No.: US 12,794,413 B2
(45) Date of Patent: Nov. 10, 2026

(54) PHOTOELECTRIC CONVERSION ELEMENT INSPECTING DEVICE, PHOTOELECTRIC CONVERSION ELEMENT MANUFACTURING DEVICE, PHOTOELECTRIC CONVERSION ELEMENT MANUFACTURING METHOD, AND PHOTOELECTRIC CONVERSION ELEMENT

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Takeshi Gotanda, Yokohama Kanagawa (JP); Haruki Ohnishi, Yokohama Kanagawa (JP); Katsuya Yamashita, Yokohama Kanagawa (JP); Yutaka Saita, Yokohama Kanagawa (JP); Tomohiro Tobari, Yokohama Kanagawa (JP)

(73) Assignees: KABUSHIKI KAISHA TOSHIBA, Tokyo (JP); TOSHIBA ENERGY SYSTEMS & SOLUTIONS CORPORATION, Kanagawa (JP)

( * ) Notice: Subject to any disclaimer, the term of this patent is extended or adjusted under 35 U.S.C. 154(b) by 38 days.

(21) Appl. No.: 18/998,141

(22) PCT Filed: Jul. 28, 2023

(86) PCT No.: PCT/JP2023/027717

§ 371 (c)(1),
(2) Date: Jan. 24, 2025

(87) PCT Pub. No.: WO2024/024936

PCT Pub. Date: Feb. 1, 2024

(65) Prior Publication Data

US 2026/0045904 A1 Feb. 12, 2026

(30) Foreign Application Priority Data

Jul. 28, 2022 (JP) ................................ 2022-120680

(51) Int. Cl.
*H02S 50/15* (2014.01)
*H10K 71/12* (2023.01)
(Continued)

(52) U.S. Cl.
CPC ............ *H02S 50/15* (2014.12); *H10K 71/12* (2023.02); *H10K 85/50* (2023.02); *H10F 10/161* (2025.01); *H10K 30/57* (2023.02)

(58) Field of Classification Search
CPC ......... H02S 50/15; H02S 50/10; H10K 71/12; H10K 85/50; H10K 30/57; H10K 30/40; H10F 10/161; Y02P 70/50; Y02E 10/549
See application file for complete search history.

(56) References Cited

U.S. PATENT DOCUMENTS

2009/0152550 A1 6/2009 Ohnuma et al.
2011/0171757 A1 7/2011 Yamamuro et al.
(Continued)

FOREIGN PATENT DOCUMENTS

JP 06-275856 9/1994
JP 2001-289793 10/2001
(Continued)

OTHER PUBLICATIONS

International Search Report and Written Opinion for International Application No. PCT/JP2023/027717 mailed on Sep. 19, 2023, 13 pgs.

*Primary Examiner* — Michael Y Sun
(74) *Attorney, Agent, or Firm* — Amin, Turocy & Watson, LLP

(57) ABSTRACT

A photoelectric conversion element inspecting device, a photoelectric conversion element manufacturing device, a
(Continued)

photoelectric conversion element manufacturing method, and a photoelectric conversion element include one or more light sources, a driving device, a camera, and a calculator. The light source irradiates a perovskite layer with inspection light capable of at least one of being transmitted through the perovskite layer and being reflected by the perovskite layer. The driving device changes at least one of a distance and an angle between a substrate having the perovskite layer and the light source. The camera detects hue of at least one of the inspection light transmitted through the perovskite layer and the inspection light reflected by the perovskite layer. The calculator calculates a position of a point with different hue on the perovskite layer detected by the camera.

2 Claims, 5 Drawing Sheets

(51) Int. Cl.

| | |
|---|---|
| ***H10K 85/50*** | (2023.01) |
| *H10F 10/161* | (2025.01) |
| *H10K 30/57* | (2023.01) |

(56) References Cited

U.S. PATENT DOCUMENTS

| | | | | |
|---|---|---|---|---|
| 2016/0118609 | A1 | 4/2016 | Takayama et al. | |
| 2018/0019360 | A1 | 1/2018 | Mishima et al. | |
| 2018/0019361 | A1 | 1/2018 | Mishima et al. | |
| 2018/0175112 | A1 | 6/2018 | Robinson et al. | |
| 2018/0226529 | A1 | 8/2018 | Uzu et al. | |
| 2019/0044080 | A1 | 2/2019 | Li et al. | |
| 2019/0051464 | A1* | 2/2019 | Gotanda | H10K 30/82 |
| 2019/0081189 | A1 | 3/2019 | Mishima et al. | |
| 2019/0105812 | A1 | 4/2019 | Qi et al. | |
| 2019/0334129 | A1 | 10/2019 | Verilhac et al. | |
| 2023/0307560 | A1 | 9/2023 | Gotanda et al. | |
| 2023/0317377 | A1 | 10/2023 | Gotanda et al. | |
| 2023/0345743 | A1 | 10/2023 | Gotanda et al. | |

FOREIGN PATENT DOCUMENTS

| | | | | | |
|---|---|---|---|---|---|
| JP | 2001289793 | A | * | 10/2001 | |
| JP | 2004-020254 | | | 1/2004 | |
| JP | 3935781 | | | 6/2007 | |
| JP | 2009-177145 | | | 8/2009 | |
| JP | 2013-053973 | | | 3/2013 | |
| JP | 2013053973 | A | * | 3/2013 | G01N 21/8806 |
| JP | 2013-084691 | | | 5/2013 | |
| JP | 2016-103493 | | | 6/2016 | |
| JP | 2019-036598 | | | 3/2019 | |
| JP | 2019-508902 | | | 3/2019 | |
| JP | 6506837 | | | 4/2019 | |
| JP | 2019-521012 | | | 7/2019 | |
| JP | 2020-506532 | | | 2/2020 | |
| JP | 6650462 | | | 2/2020 | |
| JP | 6670377 | | | 3/2020 | |
| JP | 6681754 | | | 4/2020 | |
| JP | 7032933 | | | 3/2022 | |
| WO | 2010/032465 | | | 3/2010 | |
| WO | 2016/158838 | | | 10/2016 | |
| WO | 2022/080196 | | | 4/2022 | |
| WO | 2022/101969 | | | 5/2022 | |
| WO | 2022/102128 | | | 5/2022 | |

* cited by examiner

PHOTOELECTRIC CONVERSION ELEMENT INSPECTING DEVICE, PHOTOELECTRIC CONVERSION ELEMENT MANUFACTURING DEVICE, PHOTOELECTRIC CONVERSION ELEMENT MANUFACTURING METHOD, AND PHOTOELECTRIC CONVERSION ELEMENT

TECHNICAL FIELD

Embodiments of the present invention relate to a photoelectric conversion element inspecting device, a photoelectric conversion element manufacturing device, a photoelectric conversion element manufacturing method, and a photoelectric conversion element.

Priority is claimed on Japanese Patent Application No. 2022-120680, filed Jul. 28, 2022, the content of which is incorporated herein by reference.

BACKGROUND ART

A tandem solar cell is known as a multilayer junction photoelectric conversion element. The tandem solar cell is configured as follows. That is, the tandem solar cell includes a second photoelectric conversion element including a second photoactive layer on the light reception surface side of a semiconductor substrate, and includes a first photoelectric conversion element causing the semiconductor substrate to function as a first photoactive layer, on a side opposite to the light reception surface side of the semiconductor substrate. As the second photoactive layer, a layer having a photoactive layer (hereinafter referred to as a perovskite layer) made of a material with a perovskite crystal structure is known. A photoelectric conversion element using a perovskite-type material has an advantage that an inexpensive coating method can be applied to layer formation.

When the tandem solar cell is manufactured, for example, the first photoelectric conversion element causing the semiconductor substrate to function as the first photoactive layer is formed on the side opposite to the light reception surface side of the semiconductor substrate side, and is used as an intermediate body. Next, the second photoelectric conversion element including the second photoactive layer is formed on the light reception surface side of the intermediate body to complete the tandem solar cell.

A crystalline silicon mentioned as the first photoactive layer is formed by cut-out from a silicon wafer, for example. Since there are cutting marks on a front surface of the silicon wafer, it is preferable for the perovskite layer to be thick.

However, when the perovskite layer becomes thicker, it is easy for pinholes to occur. The pinholes due to the thickening of the perovskite layer may be caused by foreign matter and may occur in a crystallization process for the perovskite. When formation of the perovskite layer is performed by a two-step coating method (a coating method in which a substrate is coated with PBI2 and then coating of MAI is performed), there are pinholes formed by a second liquid. It is easy for the pinhole due to the thickening of the perovskite layer to become an oblique pinhole that is inclined with respect to a normal direction of the perovskite layer. This oblique pinhole is difficult to discover in detection from a certain position, and there is concern that an opportunity for repair will be lost.

CITATION LIST

Patent Document

Patent Document 1

Japanese Unexamined Patent Application, First Publication No. 3935781

SUMMARY OF INVENTION

Technical Problem

The problem to be solved by the present invention is to provide a photoelectric conversion element inspecting device capable of easily detecting pinholes generated in a perovskite layer, a photoelectric conversion element manufacturing device, a photoelectric conversion element manufacturing method, and a photoelectric conversion element.

Solution to Problem

A photoelectric conversion element inspecting device, a photoelectric conversion element manufacturing device, a photoelectric conversion element manufacturing method, and a photoelectric conversion element of embodiments include one or more light sources, a driving device, a camera, and a calculator. The light source irradiates a perovskite layer with inspection light capable of at least one of being transmitted through the perovskite layer and being reflected by the perovskite layer. The driving device changes at least one of a distance and an angle between a substrate having the perovskite layer and the light source. The camera detects a hue of at least one of the inspection light transmitted through the perovskite layer and the inspection light reflected by the perovskite layer. The calculator calculates a position of a point with different hue on the perovskite layer detected by the camera.

DESCRIPTION OF EMBODIMENTS

Hereinafter, a photoelectric conversion element inspecting device, a photoelectric conversion element manufacturing device, a photoelectric conversion element manufacturing method, and a photoelectric conversion element according to embodiments will be described with reference to the drawings.

In the embodiment, the photoelectric conversion element refers to both an element that converts light into electricity, such as a solar cell or a sensor, and an element that converts electricity to light, such as a light emitting element. Both the elements have the same basic structure, although there is a difference such as whether an active layer functions as a power generation layer or functions as a light emitting layer.

[Photoelectric Conversion Element]

Figure 1:
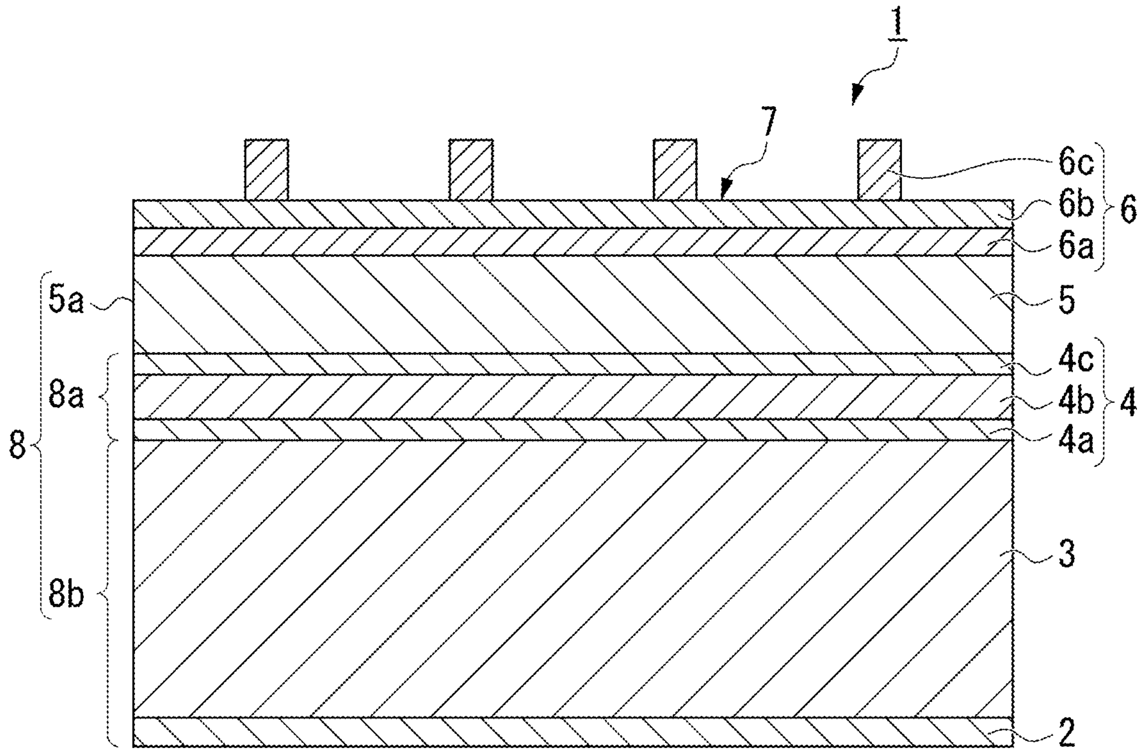
FIG. 1 is a schematic cross-sectional view showing a multilayer junction photoelectric conversion element used in a tandem solar cell according to an embodiment.

FIG. 1 shows a multilayer junction photoelectric conversion element (photoelectric conversion element) 1 that is used in a tandem solar cell.

In the multilayer junction photoelectric conversion element 1 shown in FIG. 1, a first electrode functional layer 2, a first photoactive layer 3 made of crystalline silicon, an intermediate functional layer 4, a second photoactive layer (perovskite layer) 5 made of a photoactive material having a perovskite crystal structure, and a second electrode functional layer 6 are laminated in order from the bottom in the figure to constitute a laminate 7. In the multilayer junction photoelectric conversion element 1 shown in FIG. 1, light reception surfaces of the first photoactive layer 3 and the second photoactive layer 5 are surfaces (upper surfaces in the figure) on the second electrode functional layer 6 side.

The first electrode functional layer 2 is configured to include, for example, a first electrode, and a first functional layer (conductive layer) disposed between the first electrode and the first photoactive layer 3 (none shown).

The first photoactive layer 3 is configured of a first conductivity type crystalline silicon layer. Crystalline silicon constituting the first photoactive layer 3 can have the same structure as silicon that is typically used in photovoltaic cells. Examples of a structure of the crystalline silicon include crystalline silicon containing crystalline silicon such as single crystal silicon, polycrystalline silicon, and heterojunction silicon. The crystalline silicon may be a thin film cut out from a silicon wafer. As the silicon wafer, n-type silicon crystal doped with phosphorus, arsenic, or the like, and p-type silicon crystal doped with boron, gallium, or the like can also be used. Since electrons in the p-type silicon crystal have a long diffusion length, p-type crystalline silicon is preferable as the first conductivity type crystalline silicon.

The intermediate functional layer 4 has at least the following functions. That is, the intermediate functional layer 4 has a function of connecting a bottom cell mainly configured of the first photoactive layer 3 to a top cell mainly configured of the second photoactive layer 5 in series. The intermediate functional layer 4 includes, for example, a functional layer (second conductive layer) 4*a* in contact with the first photoactive layer 3, a functional layer (buffer layer) 4*c* in contact with the second photoactive layer 5, and a transparent electrode (substrate) 4*b* sandwiched between a second conductive layer 4*a* and a buffer layer 4*c*.

The second photoactive layer 5 is made of a photoactive material having a perovskite crystal structure. The perovskite crystal structure refers to the same crystal structure as perovskite. The perovskite structure is made of ions A, B, and X, and when ion B is smaller than ion A, a perovskite structure may be formed. A chemical composition of this crystal structure can be expressed by the following general Equation (1).

$$ABX3 \qquad (1)$$

For ion A, a primary ammonium ion can be used. Specific examples of ion A include CH3NH3+ (hereinafter sometimes referred to as MA), C2H5NH3+, C3H7NH3+, C4H9NH3+, and HC(NH2) 2+ (hereinafter sometimes referred to as FA). Ion A is preferably CH3NH3+, but is not limited thereto. Ion A is preferably Cs+, or 1,1,1-trifluoroethylammonium iodide (FEAI), but is not limited thereto.

Ion B is a divalent metal ion, is preferably Pb2+ or Sn2+, but is not limited thereto.

Ion X is preferably a halogen ion and is selected from F—, Cl—, Br—, I—, and At—, for example. Ion X is preferably Cl—, Br—, or I—, but is not limited thereto.

Materials constituting the ions A, B, or X may be a single material or a mixture. The constituent ions can function even when the ions do not necessarily match a stoichiometric ratio of ABX3.

For the ions A constituting the perovskite of the second photoactive layer 5, it is preferable to have an atomic weight or a total atomic weight (molecular weight) of the ion of 45 or more. More preferably, for ion A, ions not exceeding 133 are contained. Since ion A under these conditions has low stability when used alone, general MA (molecular weight 32) may be mixed therewith. When ion A is mixed with MA, a band gap of silicon approaches 1.1 eV. This is not preferable for a tandem that improves efficiency by dividing wavelengths because overall characteristics are degraded. When ion A is a combination of a plurality of ions and includes Cs, it is more preferable for a ratio of the number of Cs to a total number of ions A to be 0.1 to 0.9.

A crystal structure has a unit lattice such as a cubic crystal, a tetragonal crystal, or a rectangular crystal, and ion A is disposed at each vertex, ion B is disposed at a body center, and ion X is disposed at each face center of the cube crystal centered on the body center. In this crystal structure, an octahedron made of one ion B and six ions X included in the unit lattice has the following characteristics. That is, an octagon is easily distorted by interaction with ion A, and undergoes a phase transition to a symmetrical crystal. It is presumed that this phase transition dramatically changes physical properties of the crystal, electrons or holes are released outside the crystal, and power generation is caused.

The second electrode functional layer 6 includes, for example, a functional layer (buffer layer) 6*a* being in contact with the second photoactive layer 5, a second functional layer (conductive layer) 6*b* being in contact with the functional layer 6*a*, and a second electrode 6*c* protruding from the second functional layer 6*b*.

A first functional layer (not shown) included in the first electrode functional layer 2 and the second functional layer 6*b* included in the second electrode functional layer 6 function as follows. That is, for the second photoactive layer 5, one of the first functional layer and the second functional layer 6*b* functions as a hole transport layer, and the other functions as an electron transport layer. In order to achieve more excellent conversion efficiency, it is preferable for the multilayer junction photoelectric conversion element 1 of the embodiment to include both the first functional layer and the second functional layer 6*b*. The multilayer junction photoelectric conversion element 1 of the embodiment may include at least only the second functional layer 6*d*.

The first conductive layer (not shown) included in the first electrode functional layer 2 and the second conductive layer 4*a* included in the intermediate functional layer 4 are configured as follows. That is, in the first conductive layer and the second conductive layer 4*a*, an n-type layer, a p-type layer, a p+-type layer, a p++-type layer, and the like can be combined therewith according to the characteristics of the first photoactive layer 3 in order to improve carrier collection efficiency. When p-type silicon is used as the first photoactive layer 3, a phosphorus-doped silicon film (n layer) can be combined therewith as the second conductive layer 4*a*, and a p+ layer can be combined as the first conductive layer.

The multilayer junction photoelectric conversion element 1 shown in FIG. 1 includes two photoactive layers 3 and 5. In the multilayer junction photoelectric conversion element 1, a unit including the second photoactive layer 5 is a top cell, and a unit including the first photoactive layer 3 is a bottom cell. The multilayer junction photoelectric conversion element 1 is a tandem solar cell having a structure in which the two photoactive layers 3 and 5 are connected in series by the intermediate functional layer 4. The first electrode functional layer 2 and the second electrode functional layer 6 serve as an anode or a cathode, and electrical energy generated by the multilayer junction photoelectric conversion element 1 is extracted to the outside from the electrodes.

Figure 2:
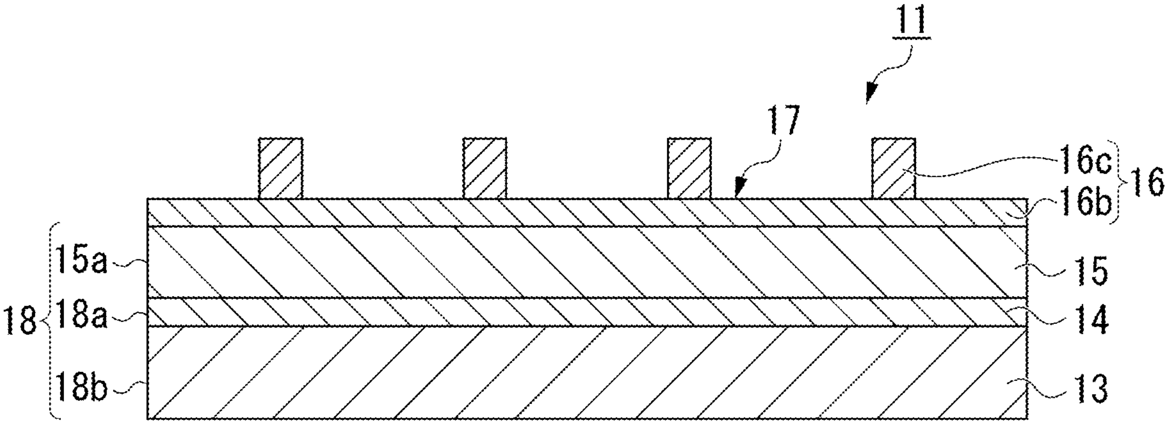
FIG. 2 is a schematic cross-sectional view showing a multilayer junction photoelectric conversion element used in the single solar cell of the embodiment.

FIG. 2 shows a multilayer junction photoelectric conversion element (photoelectric conversion element) 11 that is used in a single solar cell.

The multilayer junction photoelectric conversion element 11 shown in FIG. 2 constitutes the following laminate 17. That is, the laminate 17 includes a transparent substrate 13, a first electrode functional layer 14, a photoactive layer (perovskite layer) made of a photoactive material having a perovskite crystal structure, and a second electrode functional layer 16 laminated in order from the bottom in the figure. In the multilayer junction photoelectric conversion element 11 shown in FIG. 2, a light reception surface of the photoactive layer 15 is a surface on the second electrode functional layer 16 side (an upper surface in the figure).

The photoactive layer 15 has the same configuration as the second photoactive layer 5 of the multilayer junction photoelectric conversion element 11 in FIG. 1.

The second electrode functional layer 16 is configured to include, for example, a functional layer (conductive layer) 16*b* in contact with the photoactive layer 15, and a second electrode 16*c* protruding from the functional layer 16*b*.

The first electrode functional layer 14 and the second electrode functional layer 16 serve as an anode or a cathode, and electrical energy generated by the multilayer junction photoelectric conversion element 11 is extracted from the layers to the outside.

[Intermediate Body]

Next, an intermediate body 8 or 18 obtained in a process of manufacturing multilayer junction photoelectric conversion elements 1 and 11 will be described. The intermediate body 8 is an intermediate body in the process of manufacturing the photoelectric conversion element 1, and the intermediate body 18 is an intermediate body in the process of manufacturing the photoelectric conversion element 11.

Figure 3:
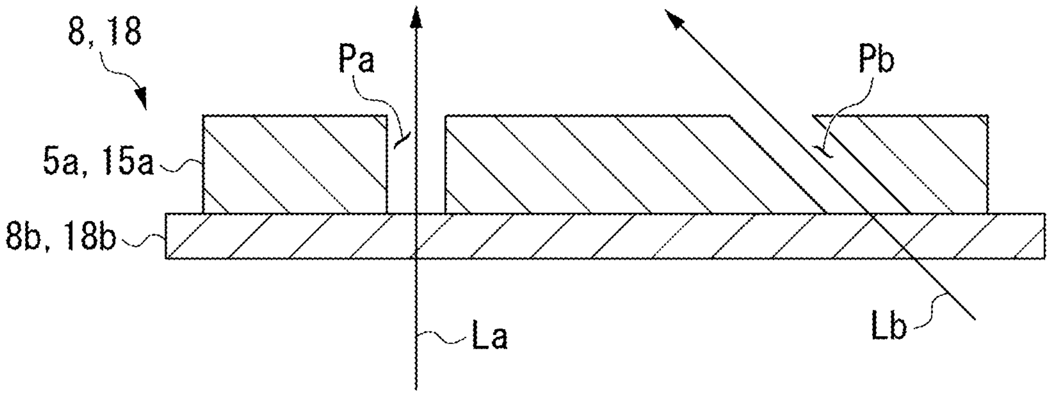
FIG. 3 is a schematic cross-sectional view showing pinholes in a perovskite layer of the multilayer junction photoelectric conversion element of the embodiment.

As shown in FIGS. 1 to 3, the intermediate body 8 or 18 includes substrates 8*b* and 18*b* having electrode layers 8*a* and 18*a* as film-formation target objects. A perovskite solution is applied onto the electrode layers 8*a* and 18*a*. The perovskite solution after coating is dried to form perovskite layer 5*a* or 15*a*. A solution coating method (and coating device) may be a method (and device) capable of supplying a solution onto a film formation target object with a uniform film thickness. For example, a liquid coating method such as a spin coating method, a slit coating method, a screen printing method, a spray method, or a meniscus coating method is applied to coat with a solution.

For example, in the intermediate body 8 in the tandem solar cell, the substrate 8*b* (the first electrode functional layer 2 and the first photoactive layer 3), the electrode layer 8*a* (intermediate functional layer 4), and the perovskite layer 5*a* are laminated. For example, the intermediate body 18 in the single solar cell includes a substrate 18*b* (transparent substrate 13), an electrode layer 18*a* (first electrode functional layer 14), and a perovskite layer 15*a* that are laminated.

For example, in the intermediate body 8 in the tandem solar cell, the crystalline silicon mentioned as the first photoactive layer 3 is formed by cutting out a silicon wafer, for example. When it is considered that there are cutting marks on a front surface of a substrate such as a silicon wafer, the perovskite layer 5*a* or 15*a* is desired to be thick.

When the perovskite layer 5*a* or 15*a* are made thicker, the perovskite layer 5*a* or 15*a* after drying have the following concern. That is, as shown in FIG. 3, a pinhole (hereinafter referred to as an oblique pinhole) Pb inclined with respect to a normal direction of the perovskite layer 5*a* or 15*a* may be formed in addition to a normal pinhole Pa penetrating the perovskite layer 5*a* or 15*a* in a thickness direction (the normal direction) perpendicular to front and back surfaces of the perovskite layer 5*a* or 15*a*. The inspection light La radiated in the normal direction does not pass through the oblique pinhole Pb, making it difficult to detect the light. Light passes through the oblique pinhole Pb as long as the light is inspection light Lb radiated in a direction inclined with respect to the normal direction. However, a direction and angle of inclination of the oblique pinhole Pb vary, and are difficult to detect even when irradiation with the inspection light in a certain direction is performed.

A solar cell is manufactured through a process in which a transparent electrode film (the second electrode functional layer 6 or 26) is laminated on the perovskite layer 5*a* or 15*a*. When an abnormality such as the presence of a pinhole or foreign matter equal to or larger than a certain size occurs in the perovskite layer 5*a* or 15*a*, it is easy for a short circuit between the front and back surfaces of the perovskite layer 5*a* or 15*a* to occur at an abnormal location of the perovskite layer 5*a* or 15*a*, which degrades a photoelectric conversion rate of a finally completed solar cell.

It is possible to curb degradation in performance by performing repair processing on this abnormal location (especially pinhole). As a treatment, for example, a solution of a raw material forming the perovskite layer 5*a* or 15*a* is attached to form a dried object having a perovskite structure (crystal). Further, as another example, an insulating substance is applied, or a solution containing an insulating substance as a solute is attached and dried so that an insulating dried material is left. Further, as another example, the electrode on the front and back surfaces of the perovskite layer 5*a* or 15*a* is removed using a laser, or a surface of the substrate 8*b* in contact with the pinhole is baked by laser irradiation so that an insulating portion is formed. Whether the electrode is removed or baked depends on the energy of the laser. This prevents short circuits in the pinholes of the perovskite layer 5*a* or 15*a*, and maintains good conversion efficiency of the solar cell.

[Photoelectric Conversion Film Element Inspecting Device and Photoelectric Conversion Element Manufacturing Device]

Next, a photoelectric conversion element inspecting device and manufacturing device according to an embodiment will be described with reference to the drawings.

First Embodiment

Figure 4:
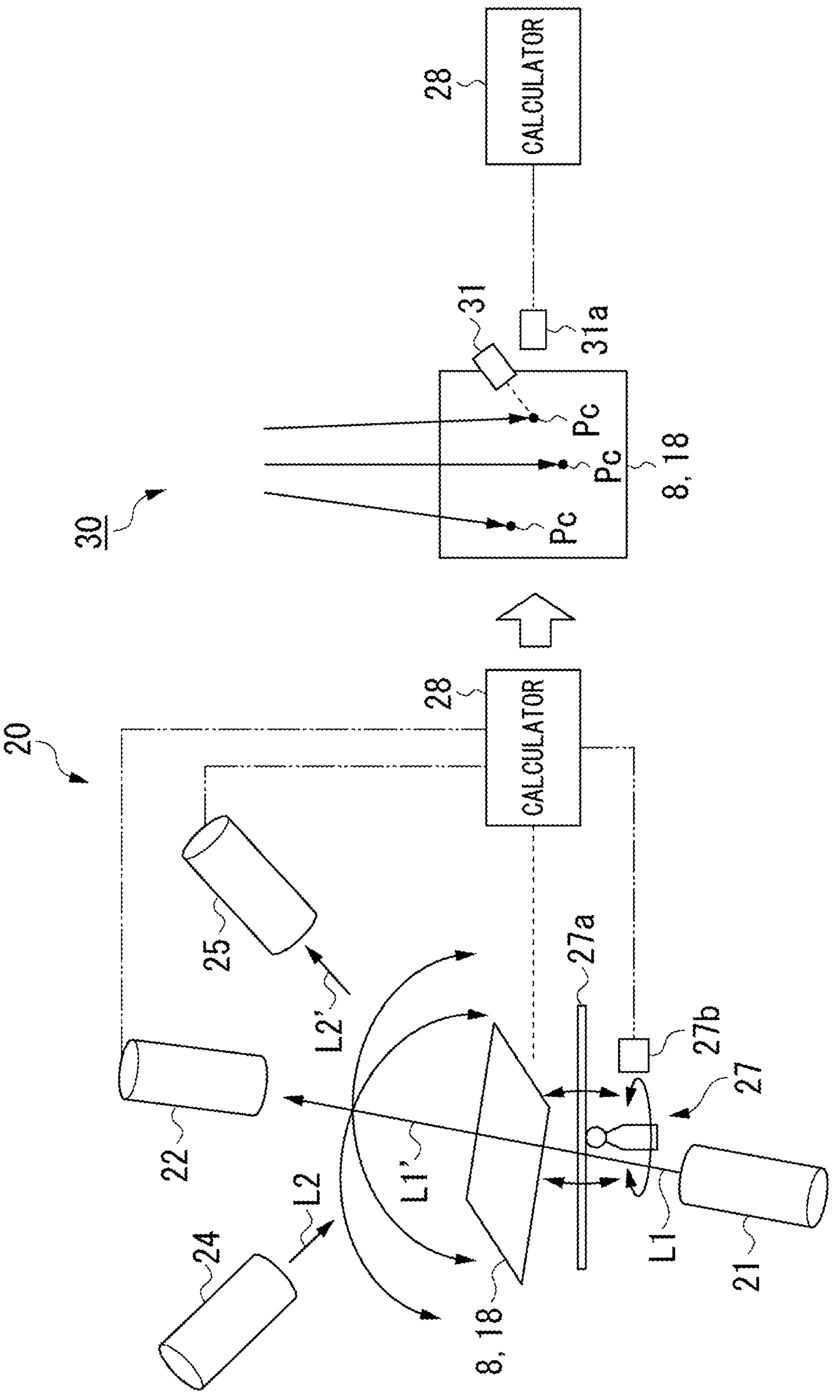
FIG. 4 is a schematic diagram showing a first embodiment of a photoelectric conversion element inspecting device and a photoelectric conversion element manufacturing device according to an embodiment.

FIG. 4 schematically shows a process of manufacturing the photoelectric conversion element in the first embodiment.

As shown in FIG. 4, a photoelectric conversion element inspecting device 20 of the first embodiment irradiates the intermediate body 8 or 18 with inspection light (for example, visible light with a wavelength that is strongly reflected by ITO (transparent conductive film)) while moving the intermediate body 8 or 18 with the perovskite layer 5*a* or 15*a* formed therein. The inspection device 20 discovers an abnormality in the perovskite layer 5*a* or 15*a* by detecting the hue of the inspection light (at least one of transmitted light and reflected light) that has passed through the perovskite layer 5*a* or 15*a*.

The photoelectric conversion element manufacturing device 30 of the first embodiment coats (attaches) an abnormal location Pc discovered by the inspection device with a perovskite solution. The manufacturing device 30 repairs the perovskite layer 5*a* or 15*a* by covering the abnormal location Pc with a dried object having a perovskite structure. For example, the perovskite solution is not limited as long as the perovskite solution is a material that forms the perovskite structure in at least a part.

As described above, the perovskite structure is one crystal structure and refers to the same crystal structure as perovskite. Typically, the perovskite structure is made of ions A, B, and X, and when ion B is smaller than ion A, the perovskite structure may be formed. A chemical composition of this crystal structure can be expressed by the following general equation (1).

$$ABX3 \qquad (1)$$

Here, a primary ammonium ion can be utilized for A. Specific examples include CH3NH3+, C2H5NH3+, C3H7NH3+, C4H9NH3+, and HC(NH2) 2+. A is preferably CH3NH3+, but is not limited thereto. Further, A is preferably Cs or 1,1,1-trifluoro-ethyl ammonium iodide (FEAI), but is not limited thereto. Further, B is a divalent metal ion, is preferably Pb2- or Sn2-, but is not limited thereto. Further, X is preferably a halogen ion. X is selected, for example, from F—, Cl—, Br—, I—, and At—, is preferably Cl—, Br— or I—, but not limited thereto. Materials constituting ions A, B, or X may be a single material or a mixture of materials. The ion can function even when constituent ions do not necessarily match a ratio of ABX3.

As shown in FIG. 4, the inspection device 20 includes a first light 21 that irradiates the perovskite layer 5*a* or 15*a* of the intermediate body 8 or 18 with the first inspection light L1 that is transmitted through the perovskite layer 5*a* or 15*a*: a first camera 22 that detects the hue of the first inspection light L1 transmitted through the perovskite layer 5*a* or 15*a*, a second light 24 that irradiates the perovskite layer 5*a* or 15*a* with the second inspection light L2 reflected on a front surface (upper surface) of the perovskite layer 5*a* or 15*a*, a second camera 25 that detects hue of the second inspection light L2 reflected by the perovskite layer 5*a* or 15*a*, a table driving device 27 that appropriately displaces a table 27*a* on which the intermediate body 8 or 18 is placed to change a distance and angle between the intermediate body 8 or 18 and the first and second lights 21 and 24, and a calculator 28 that calculates a position of a point with different hue on the perovskite layer 5*a* or 15*a* from detection information of the first camera 22 and the second camera 25.

The first light 21 is disposed below the table 27*a* that irradiates the intermediate body 8 or 18 placed on the table 27*a* with the first inspection light L1 from below. The first light 21 includes a light source such as a fluorescent lamp or an LED, and brightness thereof is adjusted by a dimmer. The first light 21 is disposed at an angle close to the normal direction of the intermediate body 8 or 18 so that the emitted first inspection light L1 is transmitted through the intermediate body 8 or 18 (the substrate and the perovskite layer 5*a* or 15*a*). The first inspection light L1 is transmitted through the perovskite layer 5*a* or 15*a* and becomes transmitted light L1'.

A first camera 22 on which the first inspection light L1 (transmitted light L1') transmitted through the intermediate body 8 or 18 is incident is disposed in the irradiation direction of the first light 21 above the table 27*a*. The first camera 22 photographs a portion of the upper surface of the perovskite layer 5*a* or 15*a* through which the first inspection light L1 is transmitted. The first camera 22 converts the transmitted light L1' of a photographed portion into an electrical signal and transmits the electrical signal to a signal processing unit of the calculator 28. The signal processing unit detects, from an image taken by the first camera 22, a location with different hue from a general location (normal location) that occupies most of the perovskite layer 5*a* or 15*a*. The "location with different hue" appears according to the abnormality such as the pinhole in the perovskite layer 5*a* or 15*a*. The calculator 28 recognizes the "location with different hue" as the abnormal location Pc. The first camera 22 and the first light 21 constitute a transmission type inspection device.

A second light 24 that irradiates the intermediate body 8 or 18 on the table 27*a* with the second inspection light L2 from above is disposed above the table 27*a*. The second light 24 includes a light source such as a fluorescent lamp or an LED, and brightness thereof is adjusted by a dimmer. The second light 24 is disposed so that the emitted second inspection light L2 is obliquely incident on upper surfaces of the perovskite layer 5*a* or 15*a*. The second inspection light L2 is reflected by the upper surfaces of the perovskite layer 5*a* or 15*a* and becomes reflected light L2'.

The second camera 25 on which the second inspection light L2 (the reflected light L2') reflected by the perovskite layer 5*a* or 15*a* is incident is disposed in a direction in which the second inspection light L2 is reflected above the table 27*a*. The second camera 25 photographs a portion of the upper surface of the perovskite layer 5*a* or 15*a* that is illuminated by the second inspection light L2. The second camera 25 converts the reflected light L2' of a photographed portion into an electrical signal and transmits the electrical signal to the signal processing unit of the calculator 28. The signal processing unit detects, from an image taken by the second camera 25, the location with different hue from the general location (normal location) of the perovskite layer 5*a* or 15*a*. The calculator 28 recognizes the "location with different hue" as the abnormal location Pc. The second camera 25 and the second light 24 constitute a regular reflection type inspection device. It is preferable for the second camera 25 and the second light 24 to be tilted integrally according to a tilting operation of the intermediate body 8 or 18.

The table driving device 27 can drive the table 27*a* so that an upper surface (a surface on which the intermediate body is placed) thereof is tilted forward, backward, left, and right from a horizontal state, and can also rotate the table 27*a* around a vertical axis. Reference sign 27*b* in the figure indicates a control unit of the table driving device 27. The control unit 27*b* detects an amount of movement of the table 27*a* regarding how much the table 27*a* is tilted and rotated from a predetermined initial position, and outputs the amount of movement to the calculator 28. The calculator 28 recognizes the position of each part on an upper surface of the table 27*a* on the basis of the amount of operation of the table 27*a* output from the control unit 27*b*.

The calculator 28 is a computer device, and includes a hardware device such as a central processing unit (CPU), and a storage device that stores programs (software) and the like executed by the CPU. An output unit of each of the first camera 22 and the second camera 25 and the control unit 27*b* of the table driving device 27 are connected to an input unit of the calculator 28. A control unit 31*a* of a repairing device (an inkjet device to be described later) 31 for repairing the pinholes of the perovskite layer 5*a* or 15*a* is connected to an output unit of the calculator 28.

For example, the calculator 28 sets coordinates on the perovskite layer 5*a* or 15*a* on the basis of the amount of operation of the table 27*a* obtained from the control unit 27*b* of the table driving device 27. For example, the calculator 28 determines the following positions on the basis of a relative position and a relative angle between the table 27*a* (the intermediate layers 8 and 18) and the first and second lights 21 and 24. That is, the calculator 28 determines the position of the "point (location) with different hues" on the perovskite layer 5*a* or 15*a* detected by the first camera 22 and the second camera 25. The hue itself of the "point with different hue" differs depending on a type of abnormality in the perovskite layer 5*a* or 15*a*. The inspection device 20 of the embodiment particularly determines the position of the "point with different hue" corresponding to the pinhole in the perovskite layer 5*a* or 15*a*. The inspection device 20 can detect whether or not there is the abnormality in the perovskite layer 5*a* or 15*a* and a position of the abnormality when there is the abnormality.

The manufacturing device 30 of the first embodiment performs repairing by attaching the solution of the raw material forming the perovskite layer 5*a* or 15*a* to the position of the "point with different hue" determined by the calculator 28. Reference sign 31 in the figure indicates a repairing device that attaches (coats) the solution to the perovskite layer 5*a* or 15*a*. For example, the repairing device 31 is an inkjet device that attaches the solution. When the solution is attached to the position of the "point with the different hue" and drying the solution using the inkjet device, a perovskite structure (crystal) is formed at the position. This makes it possible to remove the pinhole in the perovskite layer 5*a* or 15*a*. Alternatively, a solution containing an insulating substance as a solute may be attached to the position of the "point with different hue" and dried so that a dried object of the solution is left, thereby preventing a short circuit in the pinhole of the perovskite layer 5*a* or 15*a*. This makes it possible to improve the conversion efficiency of the solar cell using the intermediate body 8 or 18 having the perovskite layer 5*a* or 15*a*.

In the first embodiment, a laser device of the second embodiment to be described later may be used as the repairing device 31 instead of the inkjet device.

The pinhole in the embodiment is a trace where foreign matter has peeled off in the perovskite layer 5*a* or 15*a*, a portion where the perovskite layer 5*a* or 15*a* has been made thin, or an area where the perovskite layer 5*a* or 15*a* does not exist. Although the pinhole is minute, the pinhole can be visually observed by configuring a transmission type inspection device and a regular reflection type inspection device using lights and cameras.

In particular, the oblique pinhole is difficult to detect even when irradiation with the inspection light is performed in a certain direction, but it is possible to easily detect the oblique pinhole by performing the inspection while changing a relative position and relative angle between the intermediate body 8 or 18 and the first and second lights 21 and 24.

The detected abnormal location Pc can be repaired with the solution of the raw material forming the perovskite layer 5*a* or 15*a*. An insulating dried object (film) is formed in the location repaired with the solution. Specifically, a perovskite structure (crystal) is formed at the location, and even when there is a pinhole, the pinhole is buried with an insulating material. As a result, it is possible to eliminate an influence of the abnormality (especially pinhole) in the perovskite layer 5*a* or 15*a* as much as possible, and to improve the conversion efficiency and durability of the solar cell.

The intermediate body 8 or 18 that has been repaired with the solution constitutes a photoelectric conversion element including the perovskite layer 5*a* or 15*a*, and an insulating portion formed in a pinhole extending obliquely to the normal direction of the perovskite layer 5*a* or 15*a*. With the perovskite layer 5*a* or 15*a* made as a pressure film, even when an oblique pinhole inclined with respect to the normal direction of the perovskite layer 5*a* or 15*a* easily occurs, the short circuit in the perovskite layer 5*a* or 15*a* can be curbed by post repairing. As a result, it is possible to improve the conversion efficiency and durability of the solar cell.

Second Embodiment

Next, a photoelectric conversion element inspection device and a photoelectric conversion element manufacturing device in a second embodiment will be described with reference to the drawings.

The second embodiment is particularly different from the first embodiment in the following points. That is, the second embodiment includes a table driving device 127 that horizontally moves a table 127*a* and intermediate body 8 or 18, includes a first light 121 and a second light 124 that emit diffused light, and further includes a laser device that irradiates the abnormal location of the perovskite layer 5*a* or 15*a* with laser. Other components that are the same as those in the first embodiment are denoted by the same reference signs, and detailed description thereof will be omitted.

Figure 5:
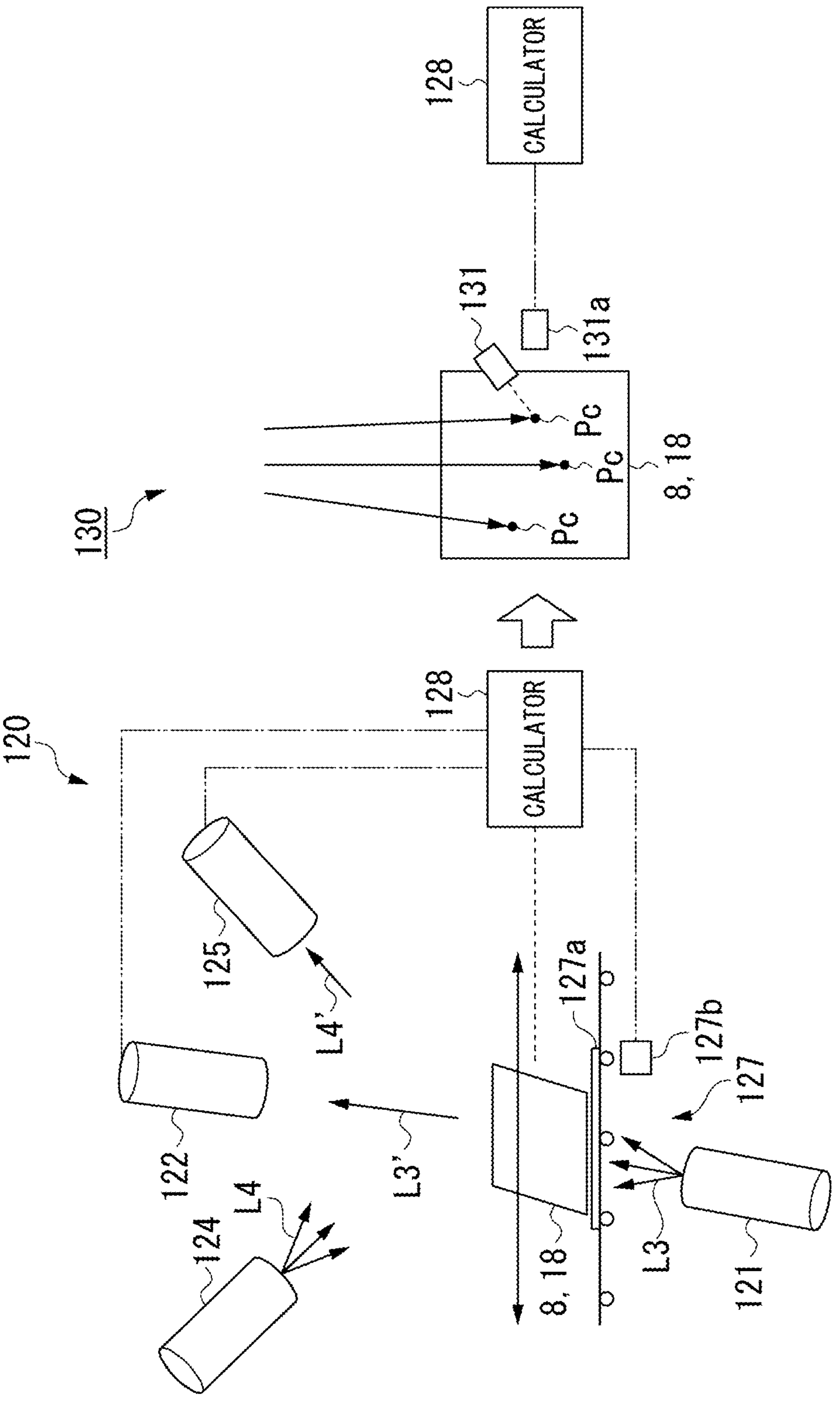
FIG. 5 is a schematic diagram showing a second embodiment of the photoelectric conversion element inspecting device and the photoelectric conversion element manufacturing device of the embodiment.

FIG. 5 schematically shows a process of manufacturing a photoelectric conversion element in the second embodiment.

As shown in FIG. 5, the inspection device 120 for photoelectric conversion element of the second embodiment irradiates the intermediate body 8 or 18 with the inspection light while moving the intermediate body 8 or 18 having the perovskite layer 5*a* or 15*a* formed therein only in a horizontal direction. The inspection light is diffused light, and an angle of incidence on the perovskite layer 5*a* or 15*a* differs depending on the position of the intermediate body 8 or 18. The inspection device 120 discovers the abnormality in the perovskite layer 5*a* or 15*a* by detecting the hue of the inspection light (at least one of transmitted light and reflected light) that has passed through the perovskite layer 5*a* or 15*a*.

A manufacturing device 130 for a photoelectric conversion element of the second embodiment irradiates an abnormal location discovered by the inspection device 120 with laser. In the manufacturing device 130, an electrode at the abnormal location is removed by using laser or an insulating portion is formed so that a short circuit at the abnormal location is prevented.

As shown in FIG. 5, the inspection device 120 includes a first light 121 that irradiates the perovskite layer 5*a* or 15*a* of the intermediate body 8 or 18 with first inspection light (diffused light) L31 that passes through the perovskite layer 5*a* or 15*a*, a first camera 122 detects hue of first inspection light L3 transmitted through the perovskite layer 5*a* or 15*a*, the second light 124 that irradiates the perovskite layer 5*a* or 15*a* with second inspection light (diffused light) L4 reflected on a front surface (upper surface) of the perovskite layer 5*a* or 15*a*, a second camera 125 that detects hue of the second inspection light L4 reflected by the perovskite layer 5*a* or 15*a*, a table driving device 127 that horizontally moves the table 127*a* on which the intermediate body 8 or 18 is placed, and a calculator 128 that calculates a position of a point with different hue on the perovskite layer 5*a* or 15*a* from detection information of the first camera 122 and the second camera 125.

The first light 121 that irradiates the intermediate body 8 or 18 placed on the table 127*a* with the first inspection light L3 from below is disposed below the table 127*a*. The first light 121 has the same configuration as the first light 21 of the first embodiment except for irradiation with diffused light.

The first camera 122 on which the first inspection light L3 (transmitted light L3') transmitted through the intermediate body 8 or 18 is incident is disposed in the irradiation direction of the first light 121 above the table 127*a*. The first camera 122 has the same configuration as the first camera 22 of the first embodiment except that the first camera 122 detects diffused light. The first camera 122 and the first light 121 constitute a transmission type inspection device.

The second light 124 that irradiates the intermediate body 8 or 18 on the table 127*a* with the second inspection light L4 from above is disposed above the table 127*a*.

The second light 124 has the same configuration as the second light 24 of the first embodiment except for irradiation with diffused light.

The second camera 125 on which the second inspection light L4 (reflected light L4') reflected by the perovskite layer 5*a* or 15*a* is incident is disposed in a direction in which the second inspection light L4 is reflected above the table 127*a*. The second camera 125 has the same configuration as the second camera 25 of the first embodiment except for detection of diffused light. The second camera 125 and the second light 124 constitute a regular reflection type inspection device.

The table driving device 127 drives the table 127*a* horizontally in front, rear, left, and right directions, with an upper surface (a surface on which the intermediate body is placed) thereof kept horizontal. Reference sign 127*b* in the figure indicates a control unit of the table driving device 127. The control unit 127*b* detects an amount of operation regarding how much the table 127*a* has moved from a predetermined initial position and outputs the amount of operation to the calculator 128. The calculator 128 recognizes a position of each part on an upper surface of the table 127*a* on the basis of the amount of operation of the table 127*a* output from the control unit 127*b*. For example, an operation amount (horizontal movement amount) of the table 127*a* is about a horizontal width of one intermediate body 8 or 18 that can be placed on the table 127*a*.

The table 127*a* and the intermediate body 8 or 18 move in a horizontal direction with respect to the first light 121 and the second light 124. The first light 121 and the second light 124 each have a light emitting element therein to emit diffused light, and al have a scattering substance that scatters the light from the light emitting element. The scattering substance is made of materials with different refractive indexes in a plate shape, a particulate shape, or the like, and is not limited as long as the scattering substance has a changing optical path.

Although the inspection device 120 is independent from a photoelectric conversion element manufacturing line, but may be incorporated in the middle of the manufacturing line. In this case, a transport conveyor of the manufacturing line may be used as the table driving device 127.

The calculator 128 has the same configuration as the calculator 28 of the first embodiment, except for details of a program that determines the position of the "point (location) with different hue" on the perovskite layer 5*a* or 15*a*.

The manufacturing device 130 of the second embodiment irradiates a position of the "point with different hue" determined by the calculator 128 with a laser to perform repairing. In the figure, reference sign 131 indicates a repairing device that irradiates the perovskite layer 5*a* or 15*a* with the laser, and reference sign 131*a* indicates a control unit of the repairing device 131. For example, the repairing device 131 is a laser device having wavelengths of 1064 nm, 532 nm, 355 nm, and 266 nm. When the position of the "point with different hue" is irradiated with the laser using the laser device, it becomes possible to remove or insulate the electrode at the abnormal location using the laser, thereby preventing a short circuit at the pinhole in the perovskite layer 5*a* or 15*a*. This makes it possible to improve the conversion efficiency of the solar cell using the intermediate body 8 or 18 having the perovskite layer 5*a* or 15*a*.

In the second embodiment, the inkjet device of the first embodiment may be used as the repairing device 131 instead of the laser device.

Third Embodiment

Next, a photoelectric conversion element inspection device and a photoelectric conversion element manufacturing device in a third embodiment will be described with reference to the drawings.

The third embodiment particularly differs from the first embodiment in that a spin coating device that coats a substrate with a perovskite solution is used as a table driving device. Other components that are the same as those in the first embodiment are denoted by the same reference signs, and detailed description thereof will be omitted.

Figure 6:
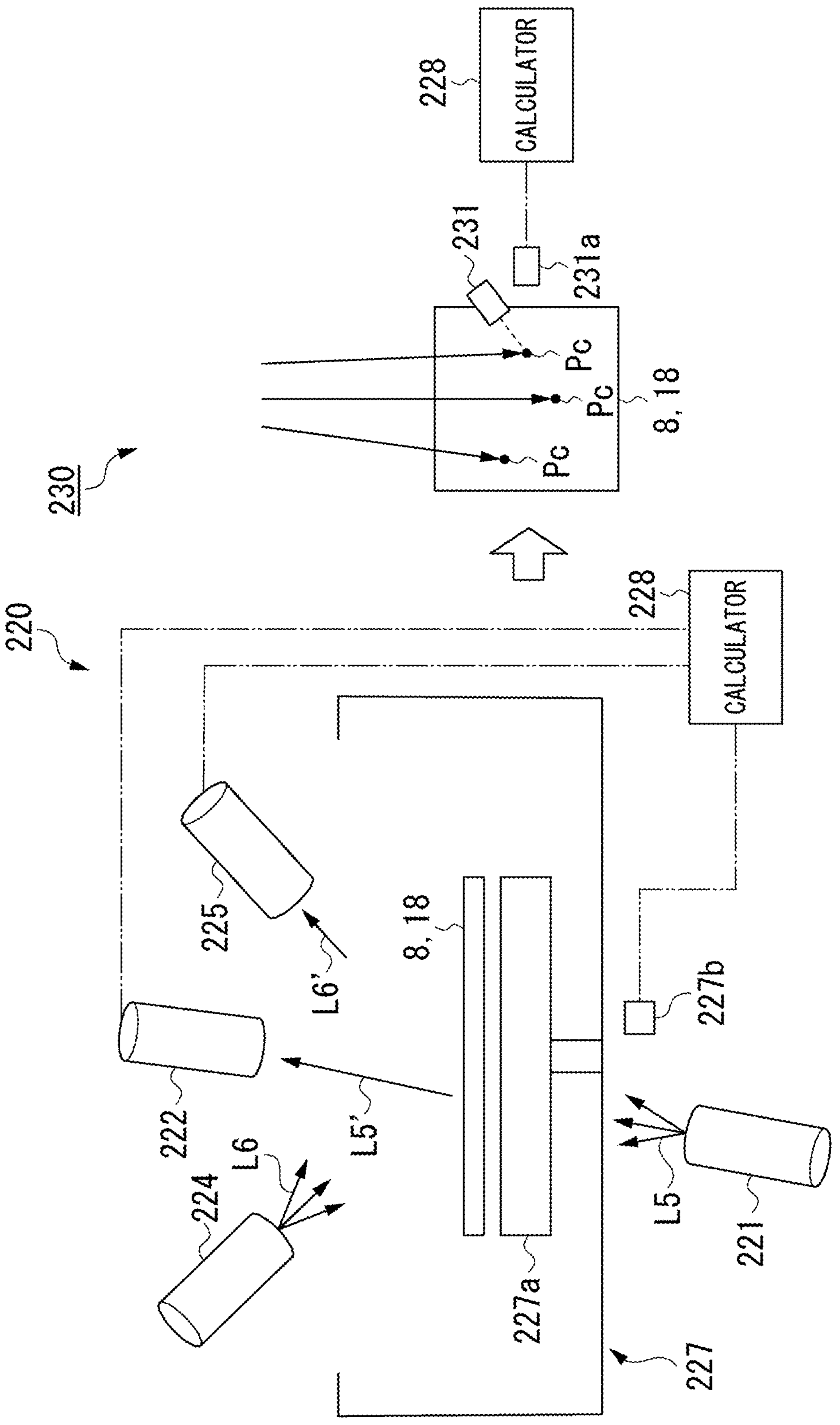
FIG. 6 is a schematic diagram showing a third embodiment of the photoelectric conversion element inspecting device and the photoelectric conversion element manufacturing device of the embodiment.

FIG. 6 schematically shows a process of manufacturing a photoelectric conversion element in the third embodiment.

As shown in FIG. 6, the photoelectric conversion element inspecting device 220 of the third embodiment irradiates the intermediate body 8 or 18 with the inspection light, while rotating the intermediate body 8 or 18 having the perovskite layer 5*a* or 15*a* formed therein around a vertical axis. The inspection light is diffused light, and the angle of incidence on the perovskite layer 5*a* or 15*a* differs depending on the position of the intermediate body 8 or 18. The inspection device 220 discovers an abnormality in the perovskite layer

5*a* or 15*a* by detecting the hue of the inspection light (at least one of transmitted light and reflected light) that has passed through the perovskite layer 5*a* or 15*a*.

The photoelectric conversion element manufacturing device 230 of the third embodiment coats the abnormal location discovered by the inspection device 220 with the perovskite solution or a solution containing a solute with an insulating property as in the first embodiment, or irradiates the abnormal location with a laser as in the second embodiment.

As shown in FIG. 6, the inspection device 220 includes a first light 221 that irradiates the perovskite layer 5*a* or 15*a* of the intermediate body 8 or 18 with first inspection light L5 (diffused light) that is transmitted through the perovskite layer 5*a* or 15*a*, a first camera 222 that detects hue of the first inspection light L5 that is transmitted through the perovskite layer 5*a* or 15*a*, a second light 224 that irradiates the perovskite layer 5*a* or 15*a* with second inspection light L6 (diffused light) reflected on the front surface (upper surface) of the perovskite layer 5*a* or 15*a*, a second camera 225 that detects hue of the second inspection light L6 reflected on the perovskite layer 5*a* or 15*a*, a spin code device (driving device) 227 that horizontally rotates the table 227*a* on which the intermediate body 8 or 18 is placed, and a calculator 228 that calculates a position of a point with different hue on the perovskite layer 5*a* or 15*a* from detection information of the first camera 222 and the second camera 225.

The first light 221 that irradiates the intermediate body 8 or 18 placed on the table 227*a* with the first inspection light L5 from below is disposed below the table 227*a*. The first light 221 has the same configuration as the first light 221 of the first embodiment except for irradiation with diffused light.

The first camera 222 on which the first inspection light L5 (transmitted light L5') transmitted through the intermediate body 8 or 18 is incident is disposed in an irradiation direction of the first light 221 above the table 227*a*. The first camera 222 has the same configuration as the first camera 22 of the first embodiment except for detection of diffused light. The first camera 222 and the first light 221 constitute a transmission type inspection device.

A second light 224 that irradiates the intermediate body 8 or 18 on the table 227*a* with the second inspection light L6 from above is disposed above the table 227*a*. The second light 224 has the same configuration as the second light 224 of the first embodiment except for irradiation with diffused light.

The second camera 225 on which the second inspection light L6 (reflected light L6') reflected by the perovskite layer 5*a* or 15*a* is incident is disposed in a reflection direction of the second inspection light L6 above the table 227*a*. The second camera 225 has the same configuration as the second camera 25 of the first embodiment except for detection of diffused light. The second camera 225 and the second light 224 constitute a regular reflection type inspection device.

The spin coating device 227 has an inspection mode in which the table 227*a* can be rotated at a low rotation speed, unlike a known spin coating device. Reference sign 227*b* in the figure indicates a control unit of the spin coating device 227. The control unit 227*b* detects an amount of operation regarding how much the table 227*a* has rotated from a predetermined initial position and outputs the amount of operation to the calculator 228. The calculator 228 recognizes the position of each part on the upper surface of the table 227*a* on the basis of the amount of operation of the table 227*a* output from the control unit 227*b*.

The calculator 228 has the same configuration as the calculator 28 of the first embodiment, except for details of a program that determines the position of the "point (location) with different hue" on the perovskite layer 5*a* or 15*a*.

The manufacturing device 230 of the third embodiment performs repairing of the position of the "point with different hue" determined by the calculator 228. In the figure, reference sign 231 indicates the repairing device, and reference sign 231*a* indicates a control unit of the repairing device 231. A solution is attached to the position of the "point with different hue" and dried so that the pinhole in the perovskite layer 5*a* or 15*a* are removed, or an insulator is formed so that a short circuit is prevented. Alternatively, an electrode at the "point with different hue" is removed using laser or an insulating portion is formed so that the short circuit in the pinhole in the perovskite layer 5*a* or 15*a* is prevented. This makes it possible to improve the conversion efficiency of the solar cell using the intermediate body 8 or 18 having the perovskite layer 5*a* or 15*a*.

It is possible to inspect an entire area of the intermediate body 8 or 18 for the abnormality in the perovskite layer 5*a* or 15*a* while rotating the intermediate body 8 or 18 having the perovskite layer 5*a* or 15*a* formed therein, by using the spin coating device. The perovskite layer 5*a* or 15*a* is irradiated with the inspection light obliquely with respect to the normal direction of the perovskite layer 5*a* or 15*a*, so that it becomes easier to detect the oblique pinhole in the perovskite layer 5*a* or 15*a*. When the inspection light is diffused light or a relative angle between the intermediate body 8 or 18 and the first and second lights 221 and 224 can be changed, it becomes easier to detect the oblique pinhole with various inclinations. As a result, it is possible to eliminate the abnormality (especially, the pinhole) in the perovskite layer 5*a* or 15*a* as much as possible, and to improve the conversion efficiency and durability of the solar cell. It is possible to achieve reduction of an equipment cost compared to a case where a separate table driving device is provided, by using the spin coating device used in the process of manufacturing a photoelectric conversion element.

Other Embodiments

Although in each of the embodiments, the inspection device and the repairing device have been mainly described, a device that confirms the success or failure of the repairing when the repairing is performed may be further included. Specifically, a device equivalent to the inspection device may be included for inspection in a post-process of the repairing device, or return to the inspection device in a previous process may be performed and the inspection may be performed again when the repairing device has performed repairing. Further, when the inspection after repairing is performed, the inspection may be focused on a repaired location (a location determined to be abnormal before repairing). Furthermore, hue of the repaired location may be different from that of a surrounding normal location even when an abnormality determination is made depending on the content of the repairing, and thus, in this case, hue at the time of the abnormality determination before repairing may be compared with hue after the repairing so that the success or failure of the repairing is determined.

According to at least one embodiment described above, it becomes possible to detect at least one of the transmitted light and the reflected light of the inspection light while appropriately changing a relative distance and a relative angle between the substrate having the perovskite layer and the light source by having one or more light sources, a driving device, a camera, and a calculator. This makes it easier to detect an abnormality in the perovskite layer. In particular, it is possible to easily detect an oblique pinhole inclined with respect to the normal direction of the perovskite layer by performing the inspection while changing the relative angle between the substrate and the light source. As a result, it is possible to eliminate the abnormality (especially, the pinhole) in the perovskite layer as much as possible, and to improve the conversion efficiency and durability of the solar cell.

Although several embodiments of the present invention have been described, these embodiments are presented as examples and are not intended to limit the scope of the invention. These embodiments can be implemented in various other forms, and various omissions, substitutions, and changes can be made without departing from the gist of the invention. These embodiments or modifications thereof are included within the scope or gist of the invention as well as within the scope of the invention described in the claims and equivalents thereof.

APPENDIX 1

A photoelectric conversion element inspecting device including: one or more light sources configured to irradiate a perovskite layer with inspection light capable of at least one of being transmitted through the perovskite layer and being reflected by the perovskite layer;

- a driving device configured to change at least one of a distance and an angle between a substrate having the perovskite layer and the light source;
- a camera configured to detect hue of at least one of the inspection light transmitted through the perovskite layer and the inspection light reflected by the perovskite layer while changing at least one of the distance and the angle between the substrate and the light source; and
- a calculator configured to calculate a position of a point with different hue on the perovskite layer from detection information of the camera.

APPENDIX 2

A photoelectric conversion element inspecting device including: one or more light sources configured to irradiate a perovskite layer with inspection light capable of at least one of being transmitted through the perovskite layer and being reflected by the perovskite layer;

- a driving device configured to change at least one of a distance and an angle between a substrate having the perovskite layer and the light source;
- a camera configured to detect hue of at least one of the inspection light transmitted through the perovskite layer and the inspection light reflected by the perovskite layer while changing at least one of the distance and the angle between the substrate and the light source;
- a calculator configured to calculate a position of a point with different hue on the perovskite layer detected by the camera; and

- a repairing device configured to attach a solution of a raw material forming the perovskite layer or a solution containing an insulating substance as a solute to the position of the point with the different hue on the perovskite layer calculated by the calculator.

APPENDIX 3

The photoelectric conversion element manufacturing device according to appendix 2, wherein the solution forms a dried object having an insulating property.

APPENDIX 4

The photoelectric conversion element manufacturing device according to appendix 2, the solution forms a dried object having a perovskite structure.

APPENDIX 5

A photoelectric conversion element manufacturing device, including:

- one or more light sources configured to irradiate a perovskite layer with inspection light capable of at least one of being transmitted through the perovskite layer and being reflected by the perovskite layer;
- a driving device configured to change at least one of a distance and an angle between a substrate having the perovskite layer and the light source;
- a camera configured to detect hue of at least one of the inspection light transmitted through the perovskite layer and the inspection light reflected by the perovskite layer while changing at least one of the distance and the angle between the substrate and the light source; and
- a calculator configured to calculate a position of a point with different hue on the perovskite layer detected by the camera; and
- a laser device configured to irradiate the position of the point with the different hue on the perovskite layer calculated by the calculator with a laser for removing electrodes on front and back surfaces of the perovskite layer, or a laser forming an insulating portion by baking a surface of the substrate being in contact with the pinhole.

APPENDIX 6

A photoelectric conversion element manufacturing device, including: a spin coating device configured to enable a front surface of a substrate to be coated with a solution of a raw material forming a perovskite structure, and enable a perovskite layer formed on the front surface of the substrate to be inspected while rotating the substrate; and

- one or more light sources configured to irradiate a perovskite layer with inspection light capable of at least one of being transmitted through the perovskite layer and being reflected by the perovskite layer;
- a camera configured to detect hue of at least one of the inspection light transmitted through the perovskite layer and the inspection light reflected by the perovskite layer while changing at least one of the distance and the angle between the substrate and the light source; and
- a calculator configured to calculate a position of a point with different hue on the perovskite layer detected by the camera.

APPENDIX 7

A photoelectric conversion element manufactured by the photoelectric conversion element manufacturing method according to appendix 2 and including:

the perovskite layer; and an insulating portion formed by attaching the solution to a pinhole extending obliquely to the normal direction of the perovskite layer and drying the solution.

APPENDIX 8

A photoelectric conversion element manufacturing method including:

irradiating a perovskite layer with inspection light capable of at least one of being transmitted through the perovskite layer and being reflected by the perovskite layer from a light source;

detecting, by a camera, hue of at least one of the inspection light transmitted through the perovskite layer and the inspection light reflected by the perovskite layer while changing, by a driving device, at least one of a distance and an angle between a substrate having the perovskite layer and the light source;

calculating, by a calculator, a position of the point with different hue on the perovskite layer detected by the camera; and irradiating the position of the point with the different hue on the perovskite layer calculated by the calculator with a laser for removing electrodes on front and back surfaces of the perovskite layer, or a laser forming an insulating portion by baking a surface of the substrate being in contact with the pinhole.

APPENDIX 9

A photoelectric conversion element manufacturing method including:

irradiating a perovskite layer with inspection light capable of at least one of being transmitted through the perovskite layer and being reflected by the perovskite layer from a light source;

detecting, by a camera, hue of at least one of the inspection light transmitted through the perovskite layer and the inspection light reflected by the perovskite layer while changing, by a driving device, at least one of a distance and an angle between a substrate having the perovskite layer and the light source; and calculating, by a calculator, a position of the point with different hue on the perovskite layer detected by the camera.

REFERENCE SIGNS LIST

1, 11 Photoelectric conversion element
5*a*, 15*a* Perovskite layer
8*b*, 18*b* Substrate
20, 120, 220 Inspection device
21, 121, 221 First light (light source)
22, 122, 222 First camera (camera)
24, 124, 224 Second light (light source)
25, 125, 225 Second camera (camera)
27, 127 Table driving device (driving device)
28, 128, 228 Calculator
30, 130, 230 Manufacturing device
31, 131, 231 Repairing device
227 Spin coating device (driving device)
L1, L3, L5 First inspection light (inspection light)
L2, L4, L6 Second inspection light (inspection light)
Pa, Pb Pinhole

The invention claimed is:

1. A photoelectric conversion element manufacturing method comprising:

irradiating a perovskite layer with inspection light capable of at least one of being transmitted through the perovskite layer and being reflected by the perovskite layer from a light source;

detecting, by a camera, a hue of at least one of the inspection light transmitted through the perovskite layer and the inspection light reflected by the perovskite layer while changing, by a driving device, at least one of a distance and an angle between a substrate having the perovskite layer and the light source;

calculating, by a calculator, a position of a point with different hue on the perovskite layer detected by the camera; and performing repair processing on the position of the point with different hue on the perovskite layer calculated by the calculator.

2. A photoelectric conversion element manufactured by the manufacturing method according to claim 1 and comprising:

the perovskite layer; and an insulating portion formed in a pinhole extending obliquely to the normal direction of the perovskite layer.

* * * * *